US012181534B2

(12) United States Patent
Ali-Ogalli et al.

(10) Patent No.: US 12,181,534 B2
(45) Date of Patent: Dec. 31, 2024

(54) METHOD AND DEVICE FOR TESTING A BATTERY STATE IN AT LEAST ONE BATTERY

(71) Applicant: CMWTEC Technologie GmbH, Runkel-Ennerich (DE)

(72) Inventors: Mohammed Radhi Ali-Ogalli, Limburg an der Lahn (DE); Michael Jacobs, Driedorf (DE); Erik Zinger, Oranienburg (DE)

(73) Assignee: CMWTEC Technologie GmbH, Runkel-Ennerich (DE)

( * ) Notice: Subject to any disclaimer, the term of this patent is extended or adjusted under 35 U.S.C. 154(b) by 114 days.

(21) Appl. No.: 17/995,861

(22) PCT Filed: Apr. 24, 2020

(86) PCT No.: PCT/EP2020/061445
§ 371 (c)(1),
(2) Date: Oct. 10, 2022

(87) PCT Pub. No.: WO2021/213669
PCT Pub. Date: Oct. 28, 2021

(65) Prior Publication Data
US 2023/0152384 A1    May 18, 2023

(51) Int. Cl.
*G01R 31/389* (2019.01)
*G01R 19/165* (2006.01)
(Continued)

(52) U.S. Cl.
CPC ....... *G01R 31/389* (2019.01); *G01R 19/1659* (2013.01); *G01R 31/3865* (2019.01); *G01R 31/392* (2019.01); *G01R 31/396* (2019.01)

(58) Field of Classification Search
CPC .. G01R 31/389; G01R 31/392; G01R 31/396; G01R 31/3865; G01R 19/1659
See application file for complete search history.

(56) References Cited

U.S. PATENT DOCUMENTS

| 5,193,067 A | 3/1993 | Sato |
| 7,759,901 B2 | 7/2010 | Hirsch |
| (Continued) | | |

FOREIGN PATENT DOCUMENTS

| CN | 107782974 A | 3/2018 |
| DE | 102004063431 A1 | 7/2005 |
| (Continued) | | |

OTHER PUBLICATIONS

Del Valle Jorge Alonso et al., "Analysis of Advanced Lithium-Ion Batteries for Battery Energy Storage Systems", 2018 IEEE International Conference on Environment and Electrical Engineering and 2018 IEEE Industrial and Commercial Power Systems Europe (EEEIC/I&CPS Europe), IEEE, Jun. 12, 2018, pp. 1-6 XP033422443.

*Primary Examiner* — Minh Q Phan
(74) *Attorney, Agent, or Firm* — Rogowski Law LLC

(57) ABSTRACT

A method and a device for testing a battery state determines if a battery is faulty. A first impedance test is conducted to determine the internal resistance of the battery, wherein the battery is energized with an electrical current flow with a certain frequency and a resulting voltage response of the battery is measured. A load high-current test of the battery with a test pulse HRD test is conducted next. Then, a second impedance test is conducted. The measurement results of the tests are recorded and stored, and then evaluated by arranging such results offset in relation to one another, in such a way that the battery state can be derived therefrom, in particular whether the battery is faulty.

16 Claims, 3 Drawing Sheets

(51) Int. Cl.
    *G01R 31/385*    (2019.01)
    *G01R 31/392*    (2019.01)
    *G01R 31/396*    (2019.01)

(56) References Cited

U.S. PATENT DOCUMENTS

| | | |
|---|---|---|
| 9,157,968 B1 | 10/2015 | Taylor |
| 11,802,917 B1 * | 10/2023 | Walther ............... G01R 31/396 |
| 2017/0350946 A1 | 12/2017 | Mukaitani |

FOREIGN PATENT DOCUMENTS

| | | |
|---|---|---|
| DE | 102013013471 A1 | 2/2015 |
| DE | 102015005132 A1 | 12/2015 |
| EP | 1037063 A1 | 9/2000 |
| EP | 1115171 A1 | 7/2001 |
| EP | 1892536 A1 | 7/2010 |
| EP | 2778697 A1 | 9/2014 |
| EP | 3507614 B1 | 7/2019 |
| WO | 2016198959 A2 | 12/2016 |

* cited by examiner

METHOD AND DEVICE FOR TESTING A BATTERY STATE IN AT LEAST ONE BATTERY

CROSS-REFERENCE TO RELATED APPLICATIONS

This application is a national stage application (under 35 USC § 371) of PCT/EP2020/061445, filed Apr. 24, 2020, the contents of which is incorporated by reference herein.

BACKGROUND OF THE INVENTION

Technical Field and State of the Art

The invention relates to a method for testing a battery state in at least one battery. A second aspect of the invention relates to a device for testing a battery state in at least one battery.

Batteries, for example, for motor vehicles, can display so-called battery faults already during their production. Consequently, the objective is to detect such battery faults as soon as possible in order to sort out defective batteries.

The most frequent battery faults can relate, for one thing, to the so-called separator of the battery.

A battery separator has the task of spatially separating the cathode and anode in batteries, or the negative and positive electrodes in rechargeable batteries. The separator has to be a barrier that electrically insulates the two electrodes from each other in order to prevent internal short circuits. At the same time, however, the separator has to be permeable to ions so that the electrochemical reactions can take place in the cell.

A battery separator has to be thin to attain the lowest possible internal resistance as well as a high packing density, thus permitting good performance data and high capacities. Moreover, separators serve to suction electrolytes and ensure gas exchange in closed cells.

A typical battery fault is what is called in English a damaged separator.

The term "short separator" refers to a battery fault in the form of a shortened separator, as a result of which the geometric contact surface area between the separator and the plate surface of the electrode is not completely covered.

Moreover, what is called an undesired "mass lump" in English can occur in the form of accumulation of dirt on the cathode or anode of the battery during production, thus markedly impairing the properties of the battery.

There can also be what is called in English a "bent plate" which could give rise to a short circuit of the battery.

Another frequent battery fault is reverse polarity. This occurs when the electrodes are inadvertently used in the reversed position when the battery was being manufactured.

Battery faults can occur not only during the production of the batteries but also during operation or use of the batteries. After all, over the course of their service lives, batteries undergo numerous charging and discharging procedures. In addition to this, there are also loads caused by temperature fluctuations. These factors contribute to the various types of undesired battery faults or battery defects that can occur.

German patent application DE 10 2015 005 132 A1 discloses a method for checking a battery for a motor vehicle whereby the cell voltage of individual cells of the battery is ascertained and the ascertained cell voltage is automatically compared to a test parameter. In this manner, motor vehicle workshops can reliably evaluate replaced batteries before they are passed on.

European patent application EP 1 037 063 A1 describes a detection apparatus for detecting faults in a battery set, comprising a voltmeter and an amperemeter. The fault detection is carried out by ascertaining the internal resistance of the battery set.

German patent application DE 10 2013 013 471 A1 discloses a method for the determination of the incoming line impedance in multicellular battery packs for purposes of detecting incoming line faults. In this process, the presence of an incoming line feeder fault is inferred if appertaining voltage differences in various cells inside the battery pack exhibit different polarity signs.

This internal resistance or the impedance of a battery is highly dependent on the frequency. It drops as the frequency increases and can have wattless components. For this reason, one can also speak of a complex impedance and this is depicted either on the basis of a value and a phase, for example, in the form of a Bode plot, or else on the basis of a real part or an imaginary part, then as a locus diagram.

The most encompassing insight into battery behavior can be obtained by means of the so-called spectral impedance measurement, which is also referred to as EIS, which is short for electrochemical impedance spectroscopy. In this context, the—complex—internal resistance can be measured at several frequencies, for instance, at 0.1 Hz to 1 kHz, something that can prolong the measuring procedure to a few minutes. On the basis of the frequency response or of the locus diagram, it is possible to read off the electrochemical behavior. The occurrence of damage can be inferred if, for example, the locus diagram differs markedly from the typical curve.

For instance, German patent application DE 10 2004 063 431 A1 discloses ascertaining the internal resistance of a battery on the basis of a current-time integral of the current curve and on the basis of a voltage-time integral of a linearly-decreasing voltage response.

As mentioned above, this electrochemical impedance spectroscopy (EIS) is employed in a known manner in electrochemical systems, that is to say, in batteries, for example, in lead-acid batteries, in order to analyze, characterize and examine the electrochemical properties of the system. With this measuring technique, a spectrum of a sinusoidal signal having a frequency range between, for instance, µHz and MHz is applied onto the energy storage unit, for example, the battery, and the frequency response is then analyzed.

The impedance depicts the amplitude amplification and the phase shift. It is ascertained at different frequencies, starting from several kilohertz all the way down to the millihertz range, so as to encompass the impedance spectrum of the battery. Changes in battery behavior due to temperature, state of charge (SOC) or current load are depicted in correspondingly changed impedance curves.

European patent application EP 1 892 536 A1 discloses monitoring the state of health (SoH), the state of charge (SoC) and the strength of function (SoF), for which purpose an electrochemical impedance spectroscopy is carried out. In electrochemical impedance spectroscopy, the battery is not put under load, as a result of which the method is only suitable for determining the operating state, that is to say, the state of charge and the state of health. Both parameters are also calculated through the currently acquirable capacity or the maximally acquirable capacity in the fully charged state at a low load current and at a defined temperature.

Based on this, German patent application DE 10 2016 216 664 A1 discloses a method for determining the functional reliability of a low-voltage battery of a vehicle that is at least partially powered electrically, said battery being energized with a test pulse, whereby the functional reliability of the battery results from a correlation of the voltage course created on the battery during the test pulse relative to a prescribed functional requirement, whereby functional reliability is present if the voltage course of the battery during the test pulse satisfies several independent test criteria.

For this reason, in order to unambiguously identify several faults, the prior-art methods at first entail a single test to ascertain a fault.

For purposes of precisely identifying the battery fault or faults with the prior-art methods, at first a single measurement is carried out on the battery. Subsequently, the battery is placed in quarantine for several weeks, that is to say, it is stored, for example, in a warehouse. Afterwards, the battery is tested another time so that a conceivable additional fault might be ascertained.

This is disadvantageous since many batteries have to be put in storage for several weeks, a procedure that entails high storage costs.

By means of these prior-art test methods, it is likewise only possible to detect up to three of the five most frequent faults. Two of the most frequent faults can only be ascertained after delivery of the battery and after an operating time of 1 to 2 years.

This error recognition depends on the degree of the effect of the faults at the prescribed test time. A common test during the production of the batteries is the high rate discharge (HRD) test. This test, however, only allows the faults to be identified that display directly different electric measurements, for instance, a clearly defective cell or a torn cell bridge.

In order to nevertheless make it possible to ascertain whether the battery exhibits a fault that leads to high voltage loss or capacity loss in newly produced batteries during quality control, the batteries have to placed in "quarantine" so that that testing of the voltage loss or capacity loss can be carried out after a few weeks.

Moreover, when it comes to the prior-art test methods, some of the battery faults might only come to the fore after a prolonged time of mechanical or thermal loading of the battery or as a result of ageing; for instance, a bent plate might only cause a short circuit after certain vibrations or after ageing (sulfation).

A drawback of the known state of the art is also that the proper fulfilment of the function of batteries can only be ascertained to an insufficient degree.

Before this backdrop of the above-mentioned disadvantages, the invention has an objective of creating a method as well as a device of the above-mentioned type which allow a particularly early and precise detection of a battery fault while employing simple means.

SUMMARY OF THE INVENTION

The invention relates to a method for testing a battery state in at least one battery, especially for ascertaining a battery fault, comprising at least the following steps: (a) carrying out a first impedance test involving determination of the internal resistance of the battery, wherein the battery is energized with an electric current and the resulting voltage response of the battery is measured, (b) acquiring and storing the measured results of this first impedance test, carrying out a high rate discharge test of the battery with a test pulse or discharge pulse, preferably for a few seconds, (c) carrying out a second impedance test, preferably after a pause of 1 to 10 seconds, especially 2 seconds, (d) acquiring and storing the measured results of this second impedance test, (e) evaluating the test in that the measured results of the first impedance test, of the second impedance test and/or of the high rate discharge test are related to each other, especially offset with respect to each other, in such a way that the battery state can be inferred from this, particularly as to whether this is a faulty battery.

In other words, at first an impedance test of the battery is carried out. Such a battery test can take a few seconds. Subsequently, there is high rate discharge test and then an impedance test is once again carried out for purposes of comparison with the first impedance test.

The measured results from the first impedance test are related to those of the second impedance test, for instance, they are offset with respect to each other. On the basis of this result and with the high rate discharge test, it is then possible to filter out the defective batteries that can then be sorted out in a simple manner.

As mentioned, the internal resistance characterizes the capacity of a battery to process a certain energy before the voltage falls below a predefined limit value such as, for example, the cut-off voltage.

The total internal resistance of the battery consists of the ohmic resistance and the charge transfer resistance (RCT), which is also referred to as the polarization resistance. The ohmic resistance constitutes the electrode resistance, electrolyte resistance, separator resistance and contact resistance of each part and it can also be evaluated by means of electrochemical impedance analysis, the so-called ACR (alternating current resistance) test, at a single frequency.

In order to determine the charge transfer resistance of the battery, the battery can be discharged with two rapid pulses, after which the voltage drop can be evaluated in accordance with the discharged current. This process uses only the direct current of the battery and it is also referred to as DCR (direct current resistance) test. In this manner, the total internal resistance of the battery can be obtained and the charge transfer resistance can then be determined on the basis thereof. These two test methods, that is to say, ACR and DCR tests, afford maximum examination capability regarding the battery power during a very limited test time, which is particularly advantageous for a production line since this does not prolong the cycle times.

In the case of the high rate discharge test, the battery is discharged by means of a test pulse or discharge pulse with a relatively high current, and the voltage is observed during and after completion of the test. This loading of the battery causes the electrochemical properties of the battery to change. An impedance analysis allows this change to be depicted in terms of faulty and fault-free batteries.

The high rate discharge test, also referred to as HRD test, is carried out by discharging the battery with a high current. For instance, the battery can be discharged with more than a ten-fold value of the so-called C-rate.

The C-rate describes the charging or discharging current of a battery, especially of a rechargeable battery, relative to its capacity. It serves, for example, to indicate the maximally permissible charging and discharging currents as a function of the rated capacity. This factor is also employed in the opposite case to specify the capacity of the rechargeable battery as a function of the discharging current intensity. The C-factor is defined as the quotient from this current and the capacity. For instance, at a capacity of 70 Ah, the 10-fold discharging current would correspond to a current intensity of 700 A. The battery can be discharged with constant current, constant voltage or constant power.

When it comes to a high rate discharge test, the open circuit voltage (OCV) and the load voltage can be deployed at the end of the discharge pulse (constant current voltage—CCV) in order to draw a conclusion about the battery state.

The tested batteries can be, for instance, so-called flooded lead-acid batteries or also closed batteries as well as lithium-ion batteries.

According to a first advantageous embodiment of the invention, the difference between the measured result of the first and second impedance tests is formed so that, on the basis thereof, it can be inferred whether this differential value falls outside of a prescribed interval. It is then ascertained on the basis of the differential values whether an impermissible deterioration of the battery state is present or is imminent. For example, the faulty batteries can exhibit a deviation of 10% to 30%, especially 20%, relative to the fault-free batteries.

According to an advantageous refinement of the invention, the high rate discharge test is carried out for a duration of about 1 to 10 seconds, especially for 3 seconds. This time span is advantageous in order to ensure the quality of the battery and to be able to filter out additional faulty batteries. A considerably longer test time, as is known from the state of the art, leads to a slowdown in production and to considerable energy loss during the manufacturing process.

In another advantageous variant of the invention, the measured values from the individual measurements are related to each other in a freely configurable manner. Since the measured values from the individual process steps are stored, they can be compared for various test profiles and used for additional evaluations as well as for statistical calculations. Depending on the battery type and battery capacity, the user can set certain test parameters such as current, voltage, test duration, pause time and evaluation limit. The actual measured values can then be statistically compared to previous measured data. For this purpose, the mean value and the standard deviation from the results can be determined and used, for example, to define an evaluation limit.

In an advantageous embodiment of the invention, it is provided for several, especially between 3 and 5, individual test processes to be carried out on the batteries and for the outcomes of the individual measured results to be related to each other in order to then identify faulty batteries. For instance, the test methods entailing discharging of the battery at a constant current (constant current discharge), discharging at a constant voltage (constant voltage discharge), discharging at a constant power (constant power discharge), direct-current internal-resistance measurement (DC internal resistance) and measurement of the alternating-current resistance (AC impedance) can be carried out consecutively in a test sequence and the appertaining measured results can be combined with each other.

According to a refinement of the invention, the first and/or the second impedance test(s) of the battery is/are carried out at a fixed frequency, especially at a frequency of about 1 kHz. This measurement is also referred to as a single-frequency measurement. The selected frequency depends on the battery type and on the test time. For example, in the case of lead batteries, the impedance values exhibit a stable real part and a small imaginary part starting at approximately 100 Hz up to about 1 KHz. In comparison to a measurement over a frequency spectrum, the single-frequency measurement entails the advantage of a shortened test time that nevertheless yields authoritative information about the battery condition. The single-frequency method is also known as the ACR test, which depicts the ohmic internal resistance of the battery, also referred to as the electrolyte resistance. In the present case, the method can be executed within a few milliseconds. This easily allows its use in so-called end-of-line test equipment in production lines during the manufacture of the batteries.

In a refinement of the invention, it is provided for the first and/or second impedance test(s) of the battery to be carried out at various frequencies, especially at approximately 0.5 Hz, 50 Hz and 500 Hz. This affords the capability of obtaining the optimal frequency range at which the measured results are at their most informative.

Another advantageous embodiment of the invention provides for the first and/or second impedance test(s) of the battery to be carried out over a frequency spectrum, especially over a frequency spectrum between 0.1 Hz and 1 MHz.

Fourier series can be employed for calculating the impedance. This allows the parameter of the equivalent circuit of the battery to be identified in that a certain frequency range of the spectrum is used, for instance, 0.1 Hz to 7.5 kHz for lead-acid batteries. For example, a so-called Nyquist plot can be employed to depict the impedance measured values as real and imaginary numbers through a Fourier transform to the complex number. For this purpose, the battery has to be energized over a frequency spectrum of approximately 0.1 Hz to 7.5 kHz and the signal response has to be measured. On the basis of this plot, the parameters of the of the equivalent circuit can be determined or read off. This parametrization contributes to attaining a better examination of the electrochemical properties of the batteries. The faults in the battery can also be depicted through impedance analysis in this manner.

According to another variant of the invention, the discharge pulse of the high rate discharge test is maintained for a pulse duration of 1 to 10 seconds, preferably from 2 to 4 seconds, especially 3 seconds. This increases the production cycle and reduces the energy loss.

Within the realm of lead-acid batteries, it can be provided for the test pulse or discharge pulse of the high rate discharge test to have a current intensity of about 500 to 3000 amperes. The selected current intensity depends on the battery capacity and can be determined as a function of the battery manufacturer and of the load duration. In principle, the C-rate of the battery applies here, for example, the battery can be loaded with between a one-fold and 20-fold value of the C-rate. As mentioned, the C-rate describes the charging or discharging current of a battery, especially of a rechargeable battery, relative to its capacity. It serves, for example, to indicate the maximally permissible charging and discharging currents as a function of the rated capacity. For instance, the 15-fold C-rate of a 100 Ah battery would correspond to a current intensity of 1500 A.

In an advantageous manner, it can be provided for the current intensity of the test pulse or discharge pulse of the high rate discharge test to rise stepwise. In this manner, the optimal load factor for the specific battery model can be ascertained at which the flaws can be best identified. Moreover, this also prevents unnecessary loading of the battery.

It can also be provided for so-called discharge curves—that is to say, the voltage and the current during discharging of the battery during the test—to be formed in order to precisely study the behavior of the battery under load. The discharging of the battery can be measured at a constant current or at a constant voltage or at a constant power, after which the measured results are then stored.

According to an independent idea of the invention, a device for testing a battery state in at least one battery is provided, especially for carrying out the method described above, comprising an impedance measuring device for carrying out at least a first and a second impedance test involving determination of the internal resistance of the battery, whereby a high-current device is provided for carrying out a high rate discharge test of the battery with a test pulse or discharge pulse, and whereby the device has an evaluation unit to evaluate the tests.

According to an advantageous embodiment of the invention, it is provided for the evaluation unit to be configured to acquire and store the measured results of the first and second impedance tests, especially so that, by means of the evaluation unit, the measured results of the first and second impedance tests and/or of the high rate discharge test are related to each other, especially offset with respect to each other, in such a way that the battery state can be inferred from that, particularly as to whether this is a faulty battery.

Additional objectives, advantages, features and application possibilities of the present invention ensue from the description below of an embodiment making reference to the drawing. In this context, all of the described and/or depicted features, either on their own or in any meaningful combination, constitute the subject matter of the present invention, also irrespective of their compilation in the claims or the claims to which they refer back.

DESCRIPTION OF THE DRAWINGS

The following is shown, in part schematically.

For the sake of clarity, identical components or those having the same effect are provided with the same reference numerals in the figures of the drawing shown below, making reference to an embodiment.

DETAILED DESCRIPTION

Batteries 10, for instance, for motor vehicles, can already display so-called battery faults during the production. For this reason, the objective is to detect these battery faults as soon as possible and to sort out faulty batteries 17.

As already mentioned above, one of the typical battery faults is what is called in English a damaged separator. The battery fault referred to as a "short separator", means that the geometric contact surface area between the separator and the plate surface of the electrode is not completely covered.

Moreover, there can also be what in English is called mass lumps or material accumulations that occur in the form of dirt on the cathode or anode of the battery during the production, something that severely impairs the properties of the battery.

There can also be what is called in English a bent plate, which could cause a short circuit in the battery.

Another frequent battery fault is reverse polarity. This occurs during the production of the battery 10 in that the electrodes are inadvertently used in the reversed position.

In order to be able to now ascertain such faults during the production of the batteries 10 so that the defective batteries 17 can be directly sorted out, the invention puts forward a method and device 11 for determining the battery state.

Figure 1:
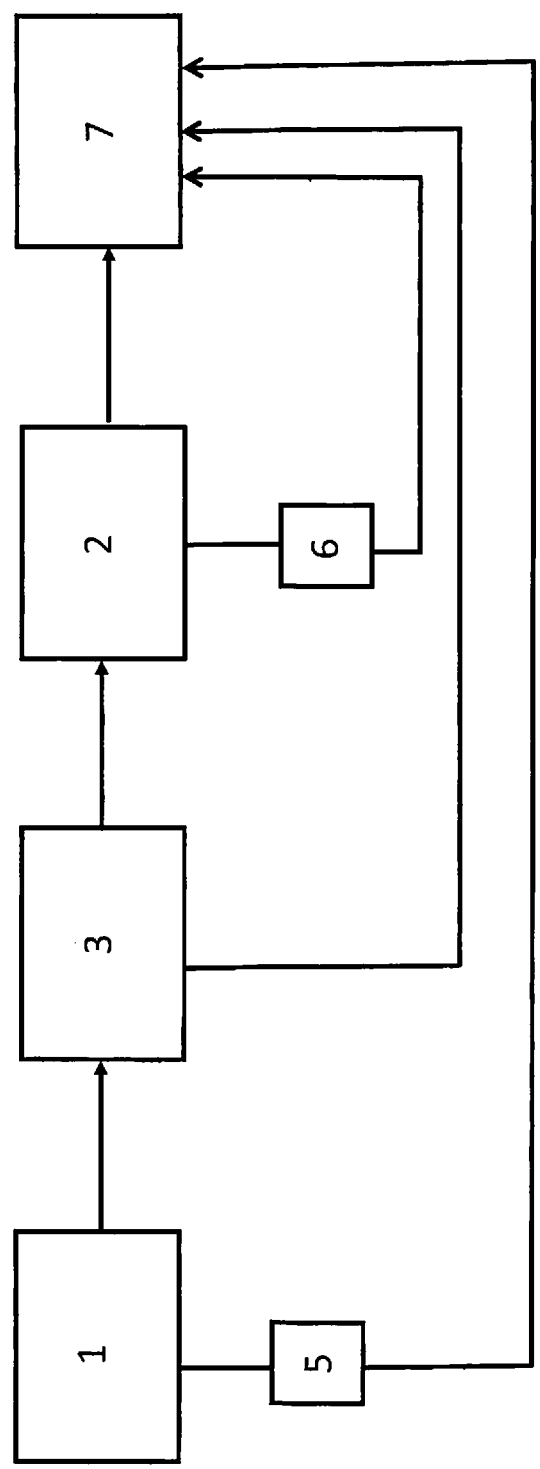
FIG. 1 the course of a method for determining a battery state.

FIG. 1 is a flowchart of a method for testing a battery state in at least one battery 10, especially for determining a battery fault, comprising at least the following steps:

Carrying out a first impedance test 1 involving the determination of the internal resistance of the battery 10, whereby the battery 10 is energized with an electric current having a certain frequency, after which the resulting voltage response of the battery 10 is measured. Such a battery test can take a few seconds.

In this process, the measured results of this first impedance test 1 are acquired and stored 5. These measured values serve as reference values for a later, additional impedance test.

Subsequently, a high rate discharge test 3 of the battery 10 is carried out with a test pulse or discharge pulse. In the high rate discharge test 3, the battery 10 is discharged by means of a test pulse or discharge pulse having a relatively high current; the voltage is observed during and after completion of the test. This loading of the battery 10 causes its electrochemical properties to change. This change can be employed by the impedance analysis since it depicts the ratio of faulty to fault-free batteries 10.

For instance, the battery 10 can be discharged with more than a 10-fold value of the so-called C-rate, whereby the C-rate describes the charging or discharging current of a battery, especially of a rechargeable battery, relative to its capacity. For example, at a capacity of 70 Ah, the 10-fold discharging current would correspond to a current intensity of 700 A. The battery can be discharged with constant current, constant voltage or constant power.

In the case of the high rate discharge test 3, the open-circuit voltage and the load voltage are employed at the end of the discharge pulse so that a conclusion about the battery state can be reached.

The tested batteries 10 can be, for instance, so-called flooded lead-acid batteries or also closed batteries as well as lithium-ion batteries.

Following this loading of the battery 10, a second impedance test 2 is carried out and again its measured results are acquired and stored 6. This second impedance test 2 serves as a comparative measurement to the first impedance test 1.

The first impedance test 1 and/or the second impedance test 2 of the battery 10 can be carried out at a fixed frequency, especially at a frequency of about 1 kHz. This measurement is also referred to as a single-frequency measurement. The selected frequency depends on the battery type and on the permissible test time. For example, in the case of lead batteries, the impedance values exhibit a stable real part and a small imaginary part starting at approximately 100 Hz up to about 1 kHz. However, it is likewise conceivable for the first impedance test 1 and/or for the second impedance test 2 of the battery 10 to be carried out at several frequencies, especially at about 0.5 Hz, 50 Hz and 500 Hz, over a frequency spectrum, especially over a frequency spectrum between 0.1 Hz and 1 MHz.

An essential aspect of the invention is the evaluation 7 of these tests, that is to say, the impedance tests 1, 2 with an in-between high rate discharge test 3.

The measured results of the first impedance test 1 and of the second impedance test 2 and/or of the high rate discharge test 3 are related to each other, especially offset with respect to each other, in an evaluation unit 16 in such a way that the battery state can be inferred from that, particularly as to whether this is a faulty battery 17.

In the present example, the difference 8 between the measured result of the first impedance test 1 and of the second impedance test 2 is formed in order to infer from this whether this differential value 8 falls outside of a prescribed interval 9. On the basis of the differential value 8, it is ascertained whether an impermissible deterioration of the battery state is present or imminent. For example, the faulty batteries 17 can have a deviation of 10% to 30%, especially 20%, relative to the fault-free batteries (10).

Figure 3:
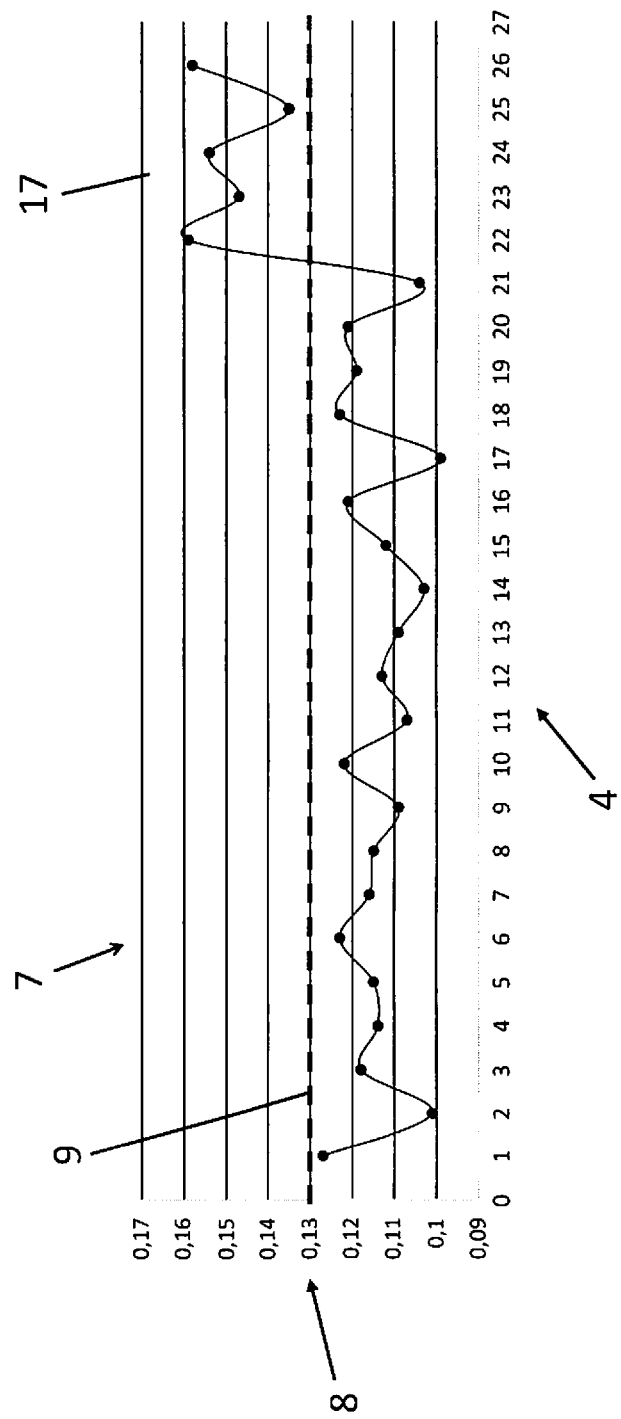
FIG. 3 a flowchart with measured results, by way of an example.

The result of such a test is shown in FIG. 3. Here, the number 4 of tested batteries 10 is plotted on the x-axis, that is to say, every tested battery 10 is associated with an unambiguous number having a corresponding measuring point. Accordingly, in the present case, 26 batteries 10 have been tested.

The difference 8 of the measured values from the first impedance test 1 and from the second impedance test 2 is shown on the y-axis. In the present embodiment, this range falls between 0.09 and 0.17.

As can also be seen in FIG. 3, a limit 9 amounting to 0.13 for the difference 8 between the impedance measurements 1, 2 was prescribed for the evaluation. It would be likewise conceivable to prescribe a certain interval 9.

The batteries 10 with the associated numbers 1 to 21 together have a value for the difference 8 that falls below the limit 9. In contrast, the differential values 8 for the batteries 10 with the numbers 22 to 26 fall clearly above this limit 9. These batteries 10 are defective batteries 17, in other words, those with a battery fault.

Figure 2:
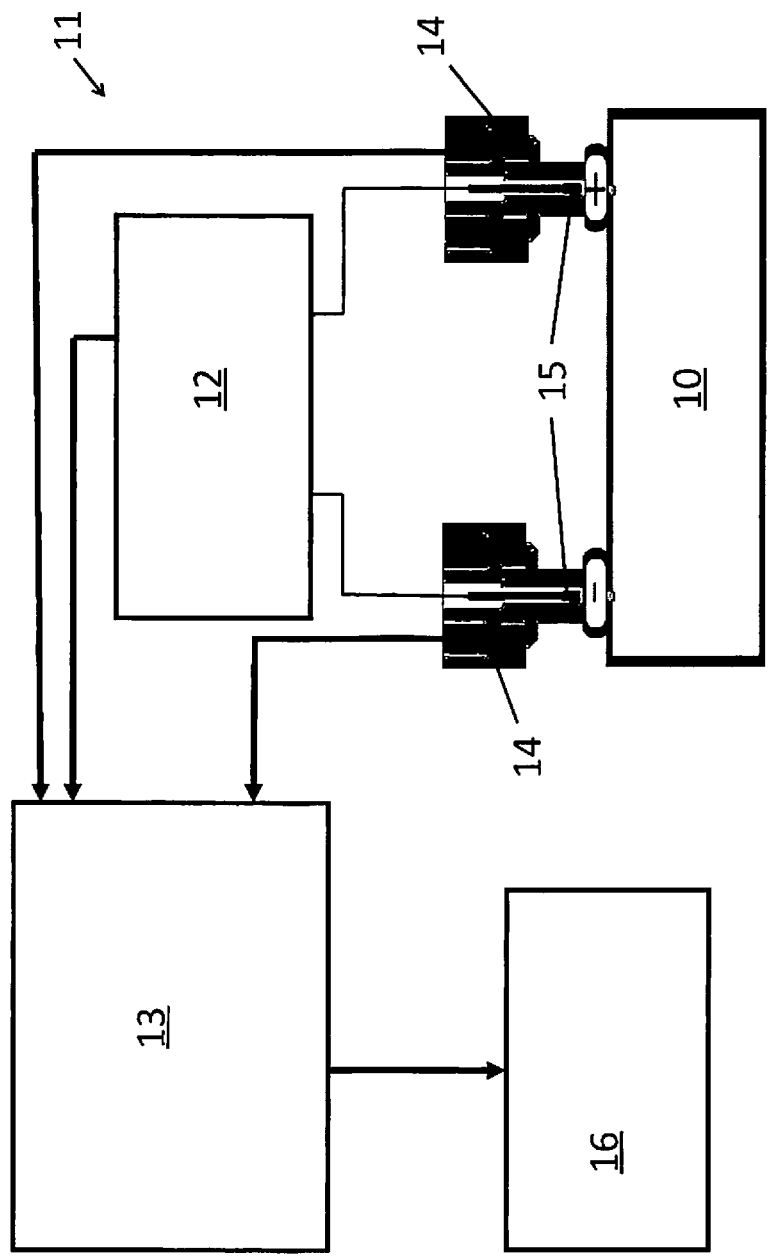
FIG. 2 a device for determining the battery state.

FIG. 2 shows a device 11 for testing a battery state in at least one battery 10, especially for carrying out the method described above, comprising an impedance measuring device 12 for carrying out at least a first impedance test 1 and a second impedance test 2 for determining the internal resistance of the battery 10.

Naturally, it is likewise conceivable within the scope of the invention to carry out more than two impedance tests 1, 2 and several high rate discharge tests 3 and to then accordingly combine the individual test results.

Likewise provided is a high rate discharge device 13 for carrying out and measuring a high rate discharge test 3 of the batteries 10 with a test pulse or a discharge pulse.

The reference numerals 15 designate measuring contactors, especially quadrupole measuring contactors for the impedance measurements. Current terminals 14, which are especially configured as current clamps, also known as current probes, can be connected to said contactors.

Moreover, the device 11 has an evaluation unit 16 for evaluating 7 the tests. The evaluation unit 16 is configured to acquire and store the measured results 5 of the first impedance test 1, of the second impedance test 2 and/or of the high rate discharge test 3.

The evaluation unit 16 can be a programmable logic controller (PLC) that is used to control or regulate the device 11 and that is programmed on a digital basis. In its simplest version, a PLC has inputs, outputs, an operation system (firmware) and an interface via which the application program can be loaded. The application program establishes how the outputs should be switched as a function of the inputs. Moreover, the evaluation unit 16 in the present embodiment is designed to analyze the measured values of the impedance tests and to output the measured results.

It is likewise conceivable within the scope of the invention for several, especially between 3 and 5, individual test processes to be carried out on a battery 10 and for the outcomes of the individual measured results to be related with each other in order to then identify a faulty battery 17. For instance, the test methods entail discharging the battery 10 at a constant current (constant current discharge), discharging at a constant voltage (constant voltage discharge), discharging at a constant power (constant power discharge), direct-current internal-resistance measurement (DC internal resistance), and measurement of the alternating-current resistance (AC impedance) can be carried out consecutively in a test sequence and the appertaining measured results can be combined with each other.

LIST OF REFERENCE NUMERALS

1 first impedance test
2 second impedance test
3 high rate discharge test
4 number of tested batteries
5 acquisition and storage of the measured results
6 acquisition and storage of the measured results
7 evaluation of the tests
8 difference
9 prescribed interval or prescribed limit
10 battery
11 device
12 impedance measuring device
13 high rate discharge device
14 current clamps
15 measuring contactors for the impedance measurement
16 evaluation unit
17 defective battery

The invention claimed is:

1. A method for testing a battery state in at least one battery (10), comprising:
    energizing the battery (10) with an electric current having a predetermined frequency, and thereafter measuring a resulting voltage response of the battery (10) as a first impedance test (1) to determine initial resistance of the battery (10),
    acquiring and storing measured results (5) of the first impedance test (1), applying a test pulse or discharge pulse to the battery (10) as a high rate discharge test (3),
    again energizing the battery (10) with the electric current of the predetermined frequency, and thereafter measuring a resulting second voltage response of the battery (10) as a second impedance test (2),
    acquiring and storing measured results (6) of the second impedance test (2), and evaluating (7) the measured results of the first impedance test (1), of the second impedance test (2) and/or of the high rate discharge test (3) to identify any offset with respect to the measured results from which battery state can be inferred so as to identify a faulty battery state.

2. The method according to claim 1, wherein any difference between the measured results of the first (1) and second (2) impedance tests is identified and compared with a prescribed limit or of a prescribed interval.

3. The method according to claim 1, wherein high rate discharge test (3) is carried out for a duration of about 1 to 10 seconds.

4. The method according to claim 1, wherein the measured values from the first (1) and second (2) impedance tests and/or of the high rate discharge test (3) are related to each other in a freely configurable manner.

5. The method according to claim 1, further comprising conducting one or more additional impedance tests and/or additional high rate discharge tests on the battery (10) and correlating the outcomes of the individual measured results of the first impedance test (1), the second impedance test (2), the high rate discharge test (3) and the additional impedance test(s) and/or additional high rate discharge test(s) in order to identify a faulty battery state.

6. The method according to claim 5, wherein each of the test methods on the battery (10) entail discharging of the battery (10) at a constant current, discharging at a constant voltage, discharging at a constant power, a direct-current internal-resistance measurement or measurement of the alternating-current resistance, wherein some or all of the test methods are carried out consecutively in a test sequence and the appertaining measured results are combined with each other.

7. The method according to claim 1, wherein the first (1) and/or the second impedance (2) test(s) of the battery (10) is/are carried out at a fixed frequency.

8. The method according to claim 1, wherein the first (1) and/or second (2) impedance test(s) of the battery (10) is/are carried out at various frequencies selected from approximately 0.5 Hz, 50 Hz and 500 Hz.

9. The method according to claim 1, wherein the first (1) and/or second (2) impedance test(s) of the battery (10) is/are carried out over a frequency spectrum between 0.1 Hz and 1 MHz.

10. The method according to claim 1, wherein the discharge pulse of the high rate discharge test (3) is maintained for a pulse duration of from 1 to 10 seconds.

11. The method according to claim 1, wherein the test pulse of the high rate discharge test (3) either has a current intensity of about 500 to 3000 amperes, or has a current intensity that amounts to between a one-fold and 20-fold value of the C-rate of the battery (10).

12. The method according to claim 1, wherein the test pulse of the high rate discharge test (3) has a current intensity that rises stepwise.

13. The method according to claim 1, for the high rate discharge test (3) the discharging of the battery (10) is measured at a constant current or at a constant voltage or at a constant power, after which the measured results are then stored.

14. The method according to claim 1, wherein the predetermined frequency of both of the first impedance test (1) and second impedance test (2) comprises a same frequency spectrum.

15. A device (11) for testing a battery state in at least one battery (10), comprising
   an impedance measuring device (12) for carrying out at least a first impedance test (1) and a second impedance test (2) involving determination of internal resistance of the battery (10), wherein the first impedance test (1) and the second impedance test (2) are carried out at a same predetermined frequency,
   a high-current device (13) for carrying out a high rate discharge test (3) of the battery (10) with a test pulse or discharge pulse, and
   an evaluation unit (16) to evaluate (7) measured results (5) of the first impedance test (1), the second impedance test (2) and the high rate discharge test (3).

16. The device (11) according to claim 15, wherein the evaluation unit (16) is configured to acquire and store the measured results (5) of the first (1) and second (2) impedance tests and the high rate discharge test (3), and is configured to correlate the measured results (2) to one another so that battery state can be inferred to determine if the battery (10) is a faulty battery (17).

* * * * *